(12) United States Patent
Lee

(10) Patent No.: US 11,467,193 B2
(45) Date of Patent: Oct. 11, 2022

(54) CURRENT DETERMINATION CIRCUIT

(71) Applicant: Sentelic Corporation, Taipei (TW)

(72) Inventor: Wen-Ting Lee, Taipei (TW)

(73) Assignee: Sentelic Corporation, Taipei (TW)

( * ) Notice: Subject to any disclaimer, the term of this patent is extended or adjusted under 35 U.S.C. 154(b) by 0 days.

(21) Appl. No.: 17/246,728

(22) Filed: May 3, 2021

(65) Prior Publication Data

US 2022/0170964 A1 Jun. 2, 2022

(30) Foreign Application Priority Data

Nov. 30, 2020 (TW) ................................. 109142106

(51) Int. Cl.
*G01R 19/14* (2006.01)
(52) U.S. Cl.
CPC .................................. *G01R 19/14* (2013.01)
(58) Field of Classification Search
CPC ...................................................... G01R 19/14
USPC .......................................................... 324/126
See application file for complete search history.

(56) References Cited

U.S. PATENT DOCUMENTS

| | | | | |
|---|---|---|---|---|
| 5,373,432 | A * | 12/1994 | Vollin ................. | H02M 3/3376 363/16 |
| 5,838,558 | A * | 11/1998 | Tan ..................... | H02M 3/3376 363/91 |
| 6,567,285 | B2 * | 5/2003 | Cho .................... | H02M 3/3376 363/17 |
| 6,737,842 | B2 * | 5/2004 | Bai ..................... | H02M 3/1588 323/284 |
| 8,576,000 | B2 * | 11/2013 | Kim .................... | H03L 7/00 257/691 |
| 8,582,323 | B2 * | 11/2013 | Schroder ............ | H02M 3/33523 363/21.12 |
| 8,957,514 | B1 * | 2/2015 | Barnette ............. | H02M 3/1584 257/691 |
| 9,112,452 | B1 * | 8/2015 | Khlat .................. | H03F 1/0227 |
| 9,219,422 | B1 * | 12/2015 | Barnette ............. | H01F 27/2847 |
| 9,618,539 | B2 * | 4/2017 | Barnette ............. | G01R 15/146 |
| 10,148,185 | B2 * | 12/2018 | Berke .................. | H02M 1/42 |

(Continued)

FOREIGN PATENT DOCUMENTS

CN 109863659 A 6/2019
EP 3389172 A1 10/2018
(Continued)

*Primary Examiner* — Christopher P McAndrew
(74) *Attorney, Agent, or Firm* — CKC & Partners Co., LLC

(57) ABSTRACT

A current determination circuit is configured to determine a state of current passing through a coil of a motor and includes a high side circuit, a low side circuit and a processor. The high side circuit is configured to output a first determination signal according to a first voltage between two ends of a first body diode of a high side transistor and the voltage level of a first control signal. The low side circuit is configured to output a second determination signal according to a second voltage between two ends of a second body diode of a low side transistor and the voltage level of a second control signal. The processor is configured to receive the first determination signal and the second determination signal and determine the state of current according to the voltage level of the first determination signal and the voltage level of the second determination signal.

17 Claims, 5 Drawing Sheets

(56) References Cited

U.S. PATENT DOCUMENTS

| | | | |
|---|---|---|---|
| 10,523,143 B2 | 12/2019 | Leman et al. | |
| 2009/0026544 A1* | 1/2009 | Uno | H01L 24/40 |
| | | | 257/365 |
| 2010/0259954 A1* | 10/2010 | Santoro | H02M 1/36 |
| | | | 363/21.02 |
| 2013/0229830 A1* | 9/2013 | Barnette | H02M 3/1584 |
| | | | 363/21.04 |
| 2013/0229831 A1* | 9/2013 | Barnette | H02M 3/1584 |
| | | | 363/21.04 |
| 2014/0132237 A1* | 5/2014 | Barnette | G05F 1/46 |
| | | | 323/286 |
| 2015/0236586 A1* | 8/2015 | Babazadeh | H02M 1/32 |
| | | | 323/272 |
| 2016/0065065 A1* | 3/2016 | Noebauer | H02M 1/38 |
| | | | 323/271 |
| 2016/0116345 A1* | 4/2016 | Furtner | G01K 7/01 |
| | | | 374/178 |
| 2016/0209853 A1* | 7/2016 | Deboy | H02M 1/08 |
| 2020/0343816 A1* | 10/2020 | Wu | H02M 1/083 |

FOREIGN PATENT DOCUMENTS

| | | |
|---|---|---|
| TW | 546901 B | 8/2003 |
| TW | 200618252 A | 6/2006 |
| TW | I629867 B | 7/2018 |
| WO | 2020/193284 A1 | 10/2020 |

* cited by examiner

CURRENT DETERMINATION CIRCUIT

CROSS-REFERENCE TO RELATED APPLICATION

This application claims priority to Taiwan Application Serial Number 109142106, filed Nov. 30, 2020, which is herein incorporated by reference in its entirety.

BACKGROUND

Field of Invention

This disclosure relates to a current determination circuit, and in particular to a current determination circuit for determining the state of coil current.

Description of Related Art

In the example of one group of the high side transistor and the low side transistor of the driving circuit of three-phase motor, the high side transistor and the low side transistor would be alternatively turned on to change the direction of coil current, so as to drive motor. When the motor is driven, there is a period (hereafter referred to as the dead zone) that the high side transistor and the low side transistor would both be in the blocking state (be turned off). It is worth noting that the direction of coil current in the dead zone can accurately reflect the instant state of motor in operation. Also, the voltage of a node, to which the high side transistor, the low side transistor and the coil are commonly coupled, would be varied according to the direction of coil current in the dead zone. Accordingly, the voltage of the node is conventionally compared with the system high voltage or the system low voltage for determining the direction of coil current in the dead zone, and then the instant information of the motor in operation would be obtained.

However, the result of determination described above can be easily affected by the system noise. The auxiliary circuit (or other special approaches) is usually required in order to measure the voltage higher than the system high voltage (or the voltage lower than the system low voltage), so as to cause the increase in cost. Furthermore, when the voltage of the node is between the system high voltage and the system low voltage, the direction of coil current usually cannot be determined.

SUMMARY

An aspect of present disclosure relates to a current determination circuit. The current determination circuit is configured to determine a state of current passing through a coil of a motor and includes a high side transistor, a low side transistor, a high side circuit, a low side circuit and a processor. The high side transistor is coupled to the coil, is configured to be selectively turned on according to the voltage level of a first control signal and includes a first body diode. The low side transistor is coupled to the coil, is configured to be selectively turned on according to the voltage level of a second control signal and includes a second body diode. The high side circuit is coupled to the high side transistor and is configured to output a first determination signal according to a first voltage between two ends of the first body diode and the voltage level of the first control signal. The low side circuit is coupled to the low side transistor and is configured to output a second determination signal according to a second voltage between two ends of the second body diode and the voltage level of the second control signal. The processor is configured to output the first control signal and the second control signal, receive the first determination signal and the second determination signal and determine the state of the current according to the voltage level of the first determination signal and the voltage level of the second determination signal.

DETAILED DESCRIPTION

The embodiments are described in detail below with reference to the appended drawings to better understand the aspects of the present disclosure. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

The terms "first", "second", etc. used in this specification do not specifically refer to order or sequence, nor are they intended to limit this disclosure. They are only used to distinguish the components or operations described in the same technical terms.

In addition, the terms "coupled" or "connected" as used herein may mean that two or more elements are directly in physical or electrical contact, or are indirectly in physical or electrical contact with each other. It can also mean that two or more elements interact with each other.

Figure 1:
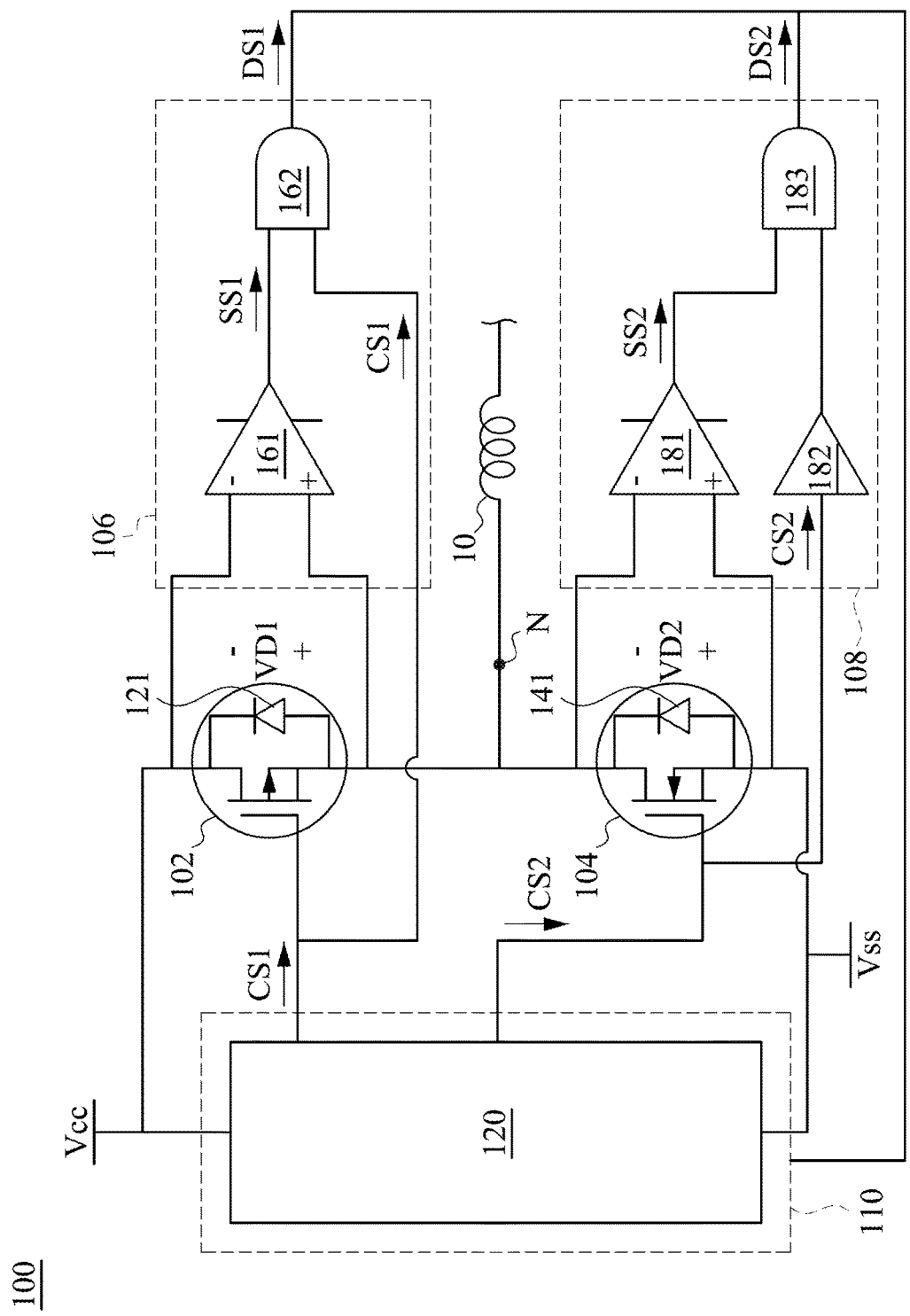
FIG. 1 is a schematic diagram of a current determination circuit in accordance to some embodiments of the present disclosure.

Referring to FIG. 1, an embodiment of the present disclosure relates to a current determination circuit 100. The current determination circuit 100 is configured to determine the state of current (e.g. current I2 of FIG. 3, current I3 of FIG. 4) passing through a coil 10 of a motor (not shown) and includes a high side transistor 102, a low side transistor 104, a high side circuit 106, a low side circuit 108 and a processor 110.

In the present embodiment, the motor is a three-phase motor. It is understood that the motor includes three coils (one of those is the coil 10 as shown in FIG. 1). However, for the purpose of simplifying description, two of the coils and two current determination circuits corresponding thereto are omitted in FIG. 1.

In structure, the processor 110 is coupled to the high side transistor 102 and the low side transistor 104 and is configured to output a first control signal CS1 and a second control signal CS2 to the high side transistor 102 and the low side transistor 104 respectively. In particular, the processor 110 includes a controller 120, and the controller 120 is configured to generate the first control signal CS1 and the second control signal CS2.

The high side transistor 102 is configured to be selectively turned on according to the voltage level of the first control signal CS1, and the low side transistor 104 is configured to be selectively turned on according to the voltage level of the second control signal CS2. As shown in FIG. 1, the high side transistor 102, the low side transistor 104 and the coil 10 of the motor are all coupled to a node N.

In particular, the high side transistor 102 includes a first end, a second end, a first control end and a first body diode 121 parasitic between the first end and the second end. The first end is configured to receive a system high voltage Vcc, the second end is coupled to the node N, and the first control end is configured to receive the first control signal CS1. A cathode end of the first body diode 121 is coupled to the first end, and an anode end of the first body diode 121 is coupled to the second end (or the node N). The low side transistor 104 includes a third end, a fourth end, a second control end and a second body diode 141 parasitic between the third end and the fourth end. The third end is coupled to the node N, the fourth end is configured to receive a system low voltage Vss, and the second control end is configured to receive the second control signal CS2. A cathode end of the second body diode 141 is coupled to the third end (or the node N), and an anode end of the second body diode 141 is coupled to the fourth end. In other words, the second end of the high side transistor 102 and the third end of the low side transistor 104 are coupled to the coil 10 of the motor.

In the present embodiment, the high side transistor 102 is P-type metal oxide semiconductor (PMOS), and the low side transistor 104 is N-type metal oxide semiconductor (NMOS). However, the present disclosure is not limited herein. In some embodiments, the high side transistor 102 can be implemented by NMOS, and the low side transistor 104 can be implemented by PMOS. In other some embodiments, the high side transistor 102 and the low side transistor 104 can be implemented by bipolar transistor (BJT).

The high side circuit 106 and the low side circuit 108 are coupled to the high side transistor 102 and the low side transistor 104 respectively. The high side circuit 106 is configured to output a first determination signal DS1 according to a first voltage VD1 between two ends of the first body diode 121 and the voltage level of the first control signal CS1 (corresponding to the conducting state of the high side transistor 102). The low side circuit 108 is configured to output a second determination signal DS2 according to a second voltage VD2 between two ends of the second body diode 141 and the voltage level of the second control signal CS2 (corresponding to the conducting state of the low side transistor 104).

In particular, the high side circuit 106 includes a first comparator 161 and a first logic gate 162. A positive input end and a negative input end of the first comparator 161 are coupled to the cathode end and the anode end of the first body diode 121 respectively. The first comparator 161 is configured to output a first state signal according to the first voltage VD1 between two ends (the cathode end and the anode end) of the first body diode 121. In the present embodiment, the first voltage VD1 is varied according to whether the current flowing forward through the first body diode 121 is existed. For example, when the current flowing forward through the first body diode 121 is existed, the first voltage VD1 (e.g. 0.7 V) between two ends of the first body diode 121 is greater than 0 V (that is, positive value). Accordingly, the voltage level of the positive input end of the first comparator 161 is greater than the voltage level of the negative input end of the first comparator 16, so that the first comparator 161 outputs the first state signal SS1 with high voltage level. When the current flowing forward through the first body diode 121 is not existed, the first voltage VD1 between two ends of the first body diode 121 is not greater than 0 V (that is, not positive value). Accordingly, the voltage level of the positive input end of the first comparator 161 is less than the voltage level of the negative input end of the first comparator 16, so that the first comparator 161 outputs the first state signal SS1 with low voltage level.

Two input ends of the first logic gate 162 are coupled to the output end of the first comparator 161 and the first control end of the high side transistor 102. The first logic gate 162 is configured to output the first determination signal DS1 with high or low voltage level according to the voltage level of the first state signal SS1 and the voltage level of the first control signal CS1. For example, when at least one of the first state signal SS1 and the first control signal CS1 is at low voltage level, the first logic gate 162 outputs the first determination signal DS1 with low voltage level. When the first state signal SS1 and the first control signal CS1 are both at high voltage level, the first logic gate 162 outputs the first determination signal DS1 with high voltage level. In the present embodiment, the first logic gate 162 is AND gate.

The low side circuit 108 includes a second comparator 181, a second logic gate 182 and a third logic gate 183. A positive input end and a negative input end of the second comparator 181 are coupled to the cathode end and the anode end of the second body diode 141 respectively. The description of the second comparator 181 is similar to those of the first comparator 161. The second voltage VD2 is varied according to whether the current flowing forward through the second body diode 141 is existed. In such way, the second comparator 181 can be configured to output a second state signal with high or low voltage level according to whether the second voltage VD2 between two ends of the second body diode 141 is positive value.

The second logic gate 182 is coupled to the second control end of the low side transistor 104 and is configured to switch the voltage level of the second control signal CS2. For example, when the processor 110 outputs the second control signal CS2 with low voltage level, the second logic gate 182 can switch the second control signal CS2 from low voltage level to high voltage level or vice versa. In the present embodiment, the second logic gate 182 is NOT gate.

Two input ends of the third logic gate 183 are coupled to the output end of the second comparator 181 and the output end of the second logic gate 182 respectively. The description of the third logic gate 183 is similar to those of the first logic gate 162. The third logic gate 183 is configured to output the second determination signal DS2 with high or low voltage level according to the voltage level of the second state signal SS2 and the voltage level of the second control signal CS2. In the present embodiment, the third logic gate 183 is AND gate.

In addition, the output end of the first logic gate 162 and the output end of the third logic gate 183 are coupled to the processor 110. In such way, the processor 110 can be configured to receive the first determination signal DS1 and the second determination signal DS2 and determine the state of the current in the coil 10 according to the voltage level of the first determination signal DS1 and the voltage level of the second determination signal DS2.

For better understanding the present disclosure, the operation of the current determination circuit 100 would be described in the following paragraphs with reference made to the accompanying drawings.

When the motor is in operation, the processor 110 of the current determination circuit 100 would control the voltage level of the first control signal CS1 and the voltage level of the second control signal CS2 by the controller 120, so as to alternatively turn on the high side transistor 102 and the low side transistor 104.

Figure 2:
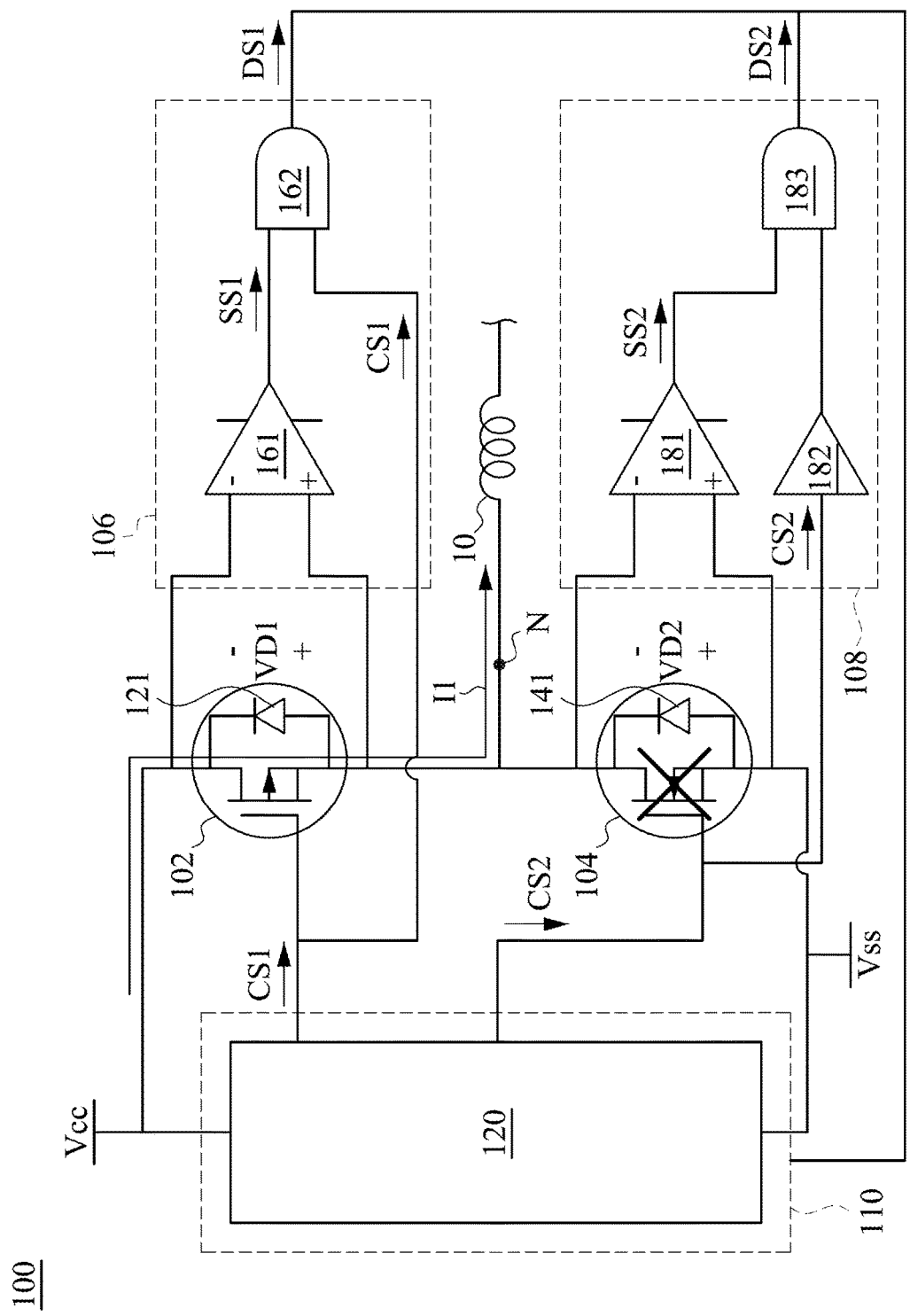
FIG. 2 is a schematic diagram of a current determination circuit in operation in accordance to some embodiments of the present disclosure.

In the present embodiment (that is, the high side transistor 102 is PMOS, and the low side transistor 104 is NMOS), referring to FIG. 2, the processor 110 first outputs the first control signal CS1 with low voltage level and the second control signal CS2 with low voltage level, so as to turn on the high side transistor 102 and turn off the low side transistor 104. In such way, the current I1 flows out of the system high voltage Vcc, sequentially passes through the high side transistor 102 and the node N and flows into the coil 10, so as to drive the motor. The processor 110 determines that the current determination circuit 100 is not in the dead zone according to the first control signal CS1 with low voltage level and the second control signal CS2 with low voltage level.

Figure 3:
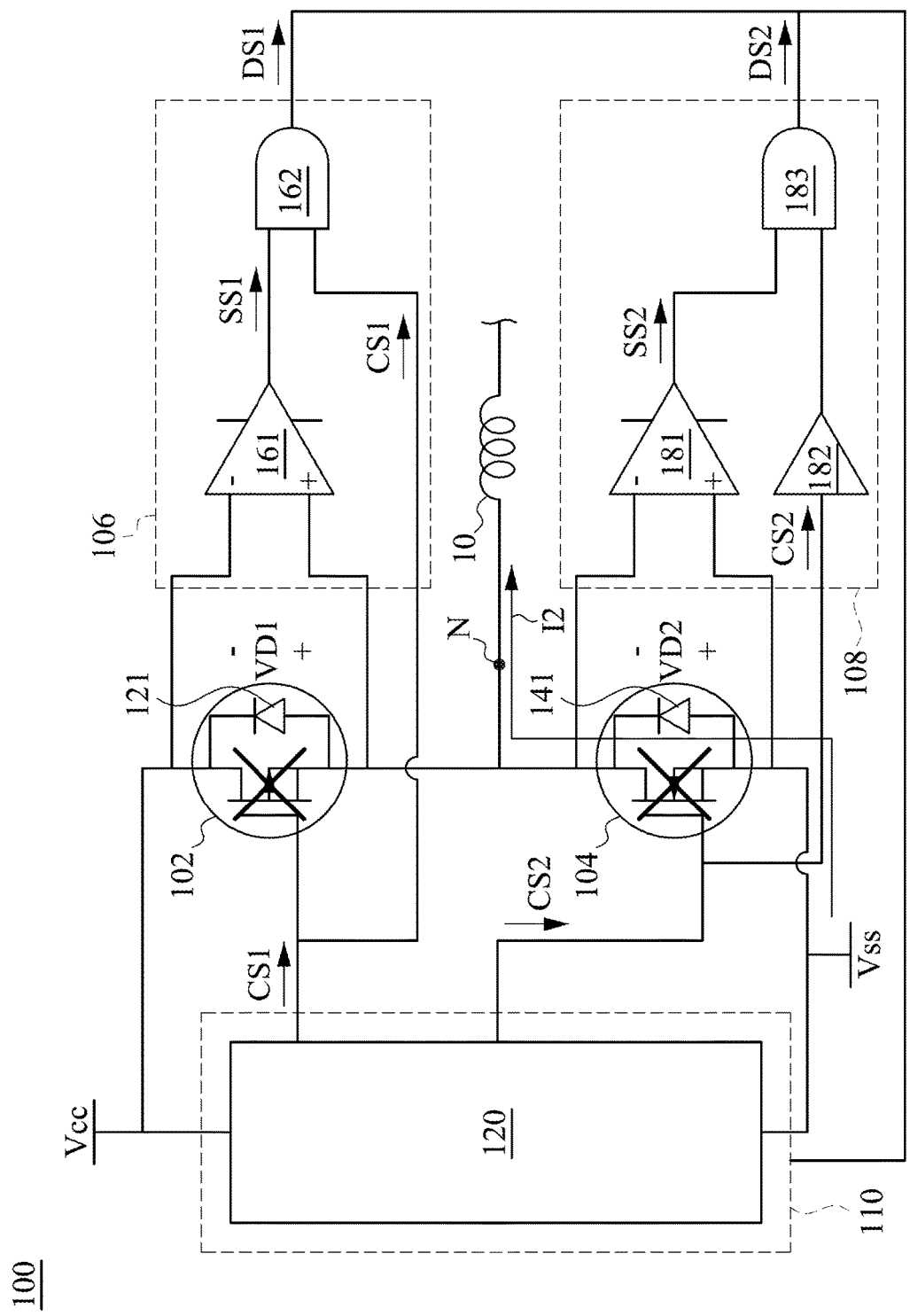
FIG. 3 is a schematic diagram of a current determination circuit in operation in accordance to some embodiments of the present disclosure.
Figure 4:
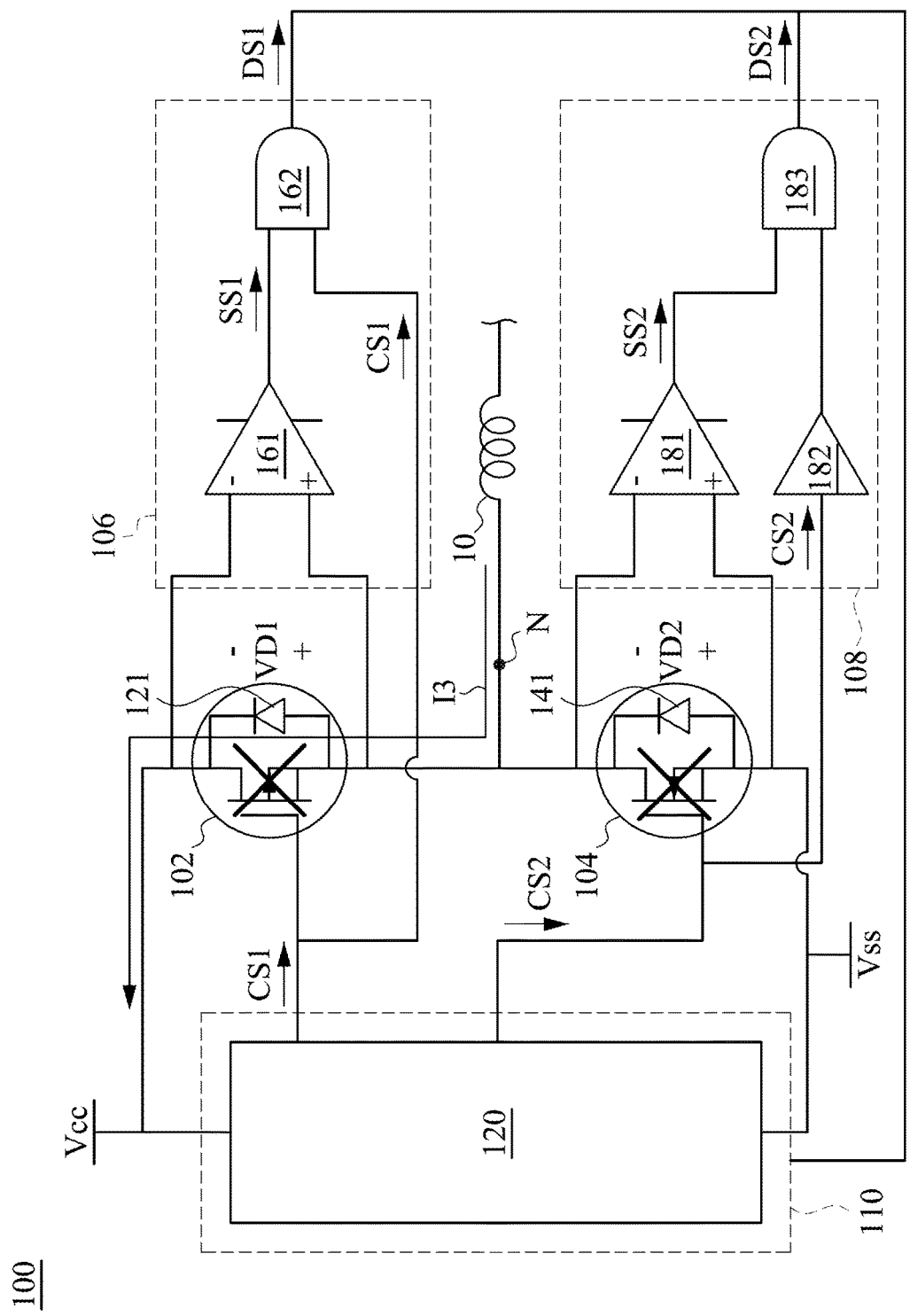
FIG. 4 is a schematic diagram of a current determination circuit in operation in accordance to some embodiments of the present disclosure.

The processor 110 then switch the first control signal CS1 from low voltage level to high voltage level, so as to switch the high side transistor 102 from the conducting state to the blocking state. Referring to FIGS. 3-4, the high side transistor 102 and the low side transistor 104 are both in the blocking state (that is, the current determination circuit 100 is in the dead zone). At the moment that the high side transistor 102 is switched from the conducting state to the blocking state (at the same time, the low side transistor 104 is maintained in the blocking state), the transient current (the current I2 as shown in FIG. 3 or the current I3 as shown in FIG. 4) is still existed. As the high side transistor 102 is completely turned off, the transient current would flow forward through the first body diode 121 or the second body diode 141, so that the first voltage VD1 or the second voltage VD2 is varied. For example, when the high side transistor 102 and the low side transistor 104 are both maintained in the blocking state, the second voltage VD2 would be positive value if the current I2 (sequentially passes through the second body diode 141 and the node N and flows into the coil 10) as shown in FIG. 3 is existed. If the current I3 (flows out of the coil 10 and sequentially passes through the node N and the first body diode 121) as shown in FIG. 4 is existed, the first voltage VD1 would be positive value. It is understood that the first voltage VD1 (because there is no current flowing forward through the first body diode 121 in FIG. 3) as shown in FIG. 3 and the second voltage VD2 (because there is no current flowing forward through the second body diode 141 in FIG. 4) as shown in FIG. 4 both would not be positive value.

Referring to FIG. 3 again, since the first voltage VD1 is not positive value (because the current I2 does not flow forward through the first body diode 121), the first comparator 161 outputs the first state signal SS1 with low voltage level according to the first voltage VD1 which is not positive value. The first logic gate 162 outputs the first determination signal DS1 with low voltage level (e.g. logic 0) according to the first state signal SS1 with low voltage level and the first control signal CS1 with high voltage level. Since the second voltage VD2 is positive value (because the current I2 flows out of the system low voltage Vss and sequentially passes through the second body diode 141 and the node N) and the second control signal CS2 is switched by the second logic gate 182 from low voltage level to the high voltage level, the second comparator 181 outputs the second state signal SS2 with high voltage level according to the second voltage VD2 which is positive value. The third logic gate 183 outputs the second determination signal DS2 with high voltage level (e.g. logic 1) according to the second state signal SS2 with high voltage level and the second control signal CS2 with high voltage level. The processor 110 determines that the current determination circuit 100 is in the dead zone according to the first control signal CS1 with high voltage level and the second control signal CS2 with low voltage level. Also, the processor 110 determines that the current I2 sequentially passes through the second body diode 141 and the node N and flows into the coil 10 according to the first determination signal DS1 with low voltage level and the second determination signal DS2 with high voltage level.

Referring to FIG. 4 again, since the first voltage VD1 is positive value (because the current I3 sequentially passes through the node N and the first body diode 121 and flows into the system high voltage Vcc), the first comparator 161 outputs the first state signal SS1 with high voltage level according to the first voltage VD1 which is positive value. The first logic gate 162 outputs the first determination signal DS1 with high voltage level (e.g. logic 1) according to the first state signal SS1 with high voltage level and the first control signal CS1 with high voltage level. Since the second voltage VD2 is not positive value (because the current I3 does not flow forward through the second body diode 141) and the second control signal CS2 is switched by the second logic gate 182 from low voltage level to the high voltage level, the second comparator 181 outputs the second state signal SS2 with low voltage level according to the second voltage VD2 which is not positive value. The third logic gate 183 outputs the second determination signal DS2 with low voltage level (e.g. logic 0) according to the second state signal SS2 with low voltage level and the second control signal CS2 with high voltage level. The processor 110 determines that the current determination circuit 100 is in the dead zone according to the first control signal CS1 with high voltage level and the second control signal CS2 with low voltage level. Also, the processor 110 determines that the current I3 flows out of the coil 10 and sequentially passes through the node N and the first body diode 121 according to the first determination signal DS1 with high voltage level and the second determination signal DS2 with low voltage level.

Figure 5:
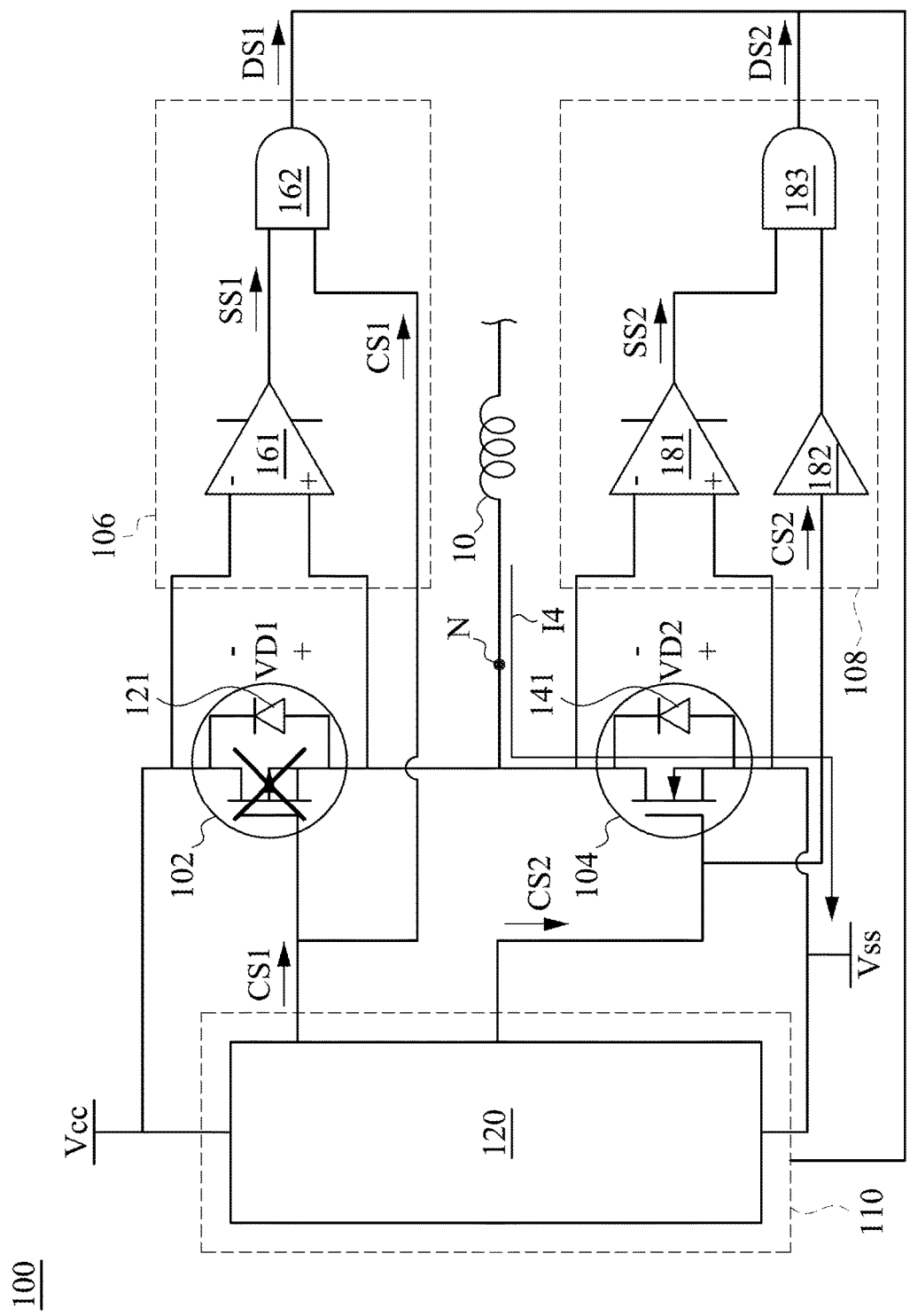
FIG. 5 is a schematic diagram of a current determination circuit in operation in accordance to some embodiments of the present disclosure.

The processor 110 then switches the second control signal CS2 from the low voltage level to high voltage level, so as to switch the low side transistor 104 from the blocking state to the conducting state. Referring to FIG. 5, the high side transistor 102 is in the blocking state, and the low side transistor 104 is in the conducting state. In such way, the current I4 would flow out of the coil 10, sequentially pass through the node N and the low side transistor 104 and flow into the system low voltage Vss, so as to drive the motor. The processor 110 determines that the current determination circuit 100 is not in the dead zone according to the first control signal CS1 with high voltage level and the second control signal CS2 with high voltage level.

It is worth noting that when the current determination circuit 100 is in the dead zone (the first control signal CS1 is at high voltage level, and the second control signal CS2 is at low voltage level), the first voltage VD1 and the second voltage VD2 might both not be positive value because the current I2 or the current I3 is exactly zero. In such way, since the first voltage VD1 is not positive value and the first control signal CS1 is at high voltage level, the first logic gate 162 outputs the first determination signal DS1 with low voltage level (e.g. logic 0) according to the first state signal SS1 with low voltage level and the first control signal CS1 with high voltage level. Since the second voltage VD2 is not positive value and the second control signal CS2 is switched by the second logic gate 182 from low voltage level to high voltage level, the third logic gate 183 outputs the second determination signal DS2 with low voltage level (e.g. logic 0) according to the second state signal SS2 with low voltage level and the second control signal CS2 with high voltage level. The processor 110 determines that the current determination circuit 100 is in the dead zone according to the first control signal CS1 with high voltage level and the second control signal CS2 with low voltage level. Also, the processor 110 determines that the current I2 or the current I3 is zero (that is, there is no current passing through the coil 10) according to the first determination signal DS1 with low voltage level and the second determination signal DS2 with low voltage level.

In addition, when the current determination circuit 100 is in the dead zone (the first control signal CS1 is at high voltage level, and the second control signal CS2 is at low voltage level), the first comparator 161 and the second comparator 181 might respectively output the first state signal SS1 with high voltage level and the second state signal SS2 with high voltage level because of the malfunction of circuit. In such way, the first logic gate 162 outputs the first determination signal DS1 with high voltage level (e.g. logic 1) according to the first state signal SS1 with high voltage level and the first control signal CS1 with high voltage level. Since the second control signal CS2 is switched by the second logic gate 182 from low voltage level to high voltage level, the third logic gate 183 outputs the second determination signal DS2 with high voltage level (e.g. logic 1) according to the second state signal SS2 with high voltage level and the second control signal CS2 with high voltage level. The processor 110 determines that the current determination circuit 100 is in the dead zone according to the first control signal CS1 with high voltage level and the second control signal CS2 with low voltage level. Also, the processor 110 determines that the state of the current passing through the coil 10 is unknown according to the first determination signal DS1 with high voltage level and the second determination signal DS2 with high voltage level. Since the state of the current passing through the coil 10 is unknown, the processor 110 determines that the current determination circuit 100 malfunctions and stops the operation of the current determination circuit 100.

In combination of the above described conditions, a truth table can be provided. In other words, the processor 110 can determine that the state of the current in the coil 10 (when the circuit is in the dead zone) according to the truth table. The truth table is shown as following:

| DS1 | DS2 | state of current in coil |
|---|---|---|
| 0 | 0 | the current is zero |
| 0 | 1 | the current flows into the coil |
| 1 | 0 | the current flows out of the coil |
| 1 | 1 | the state of the current is unknown |

By the design of the high side circuit 106 and the low side circuit 108, the current determination circuit 100 of the present disclosure can determine the state of the current in the coil 10 (when the circuit is in the dead zone) according to the first voltage VD1 between two ends of the first body diode 121 parasitic in the high side transistor 102 and the second voltage VD2 between two ends of the second body diode 141 parasitic in the low side transistor 104. Since the voltage of the node N would not be measured, the current determination circuit 100 can avoid the problems caused because of the measurement for the voltage higher than the system high voltage Vcc or lower than the system low voltage Vss. Furthermore, the processor 110 can obtain the phase information of the current and adjust the phase relationship between the current and the counter electromotive force of the motor, so that the motor can be operated at the optimal rotation speed.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A current determination circuit configured to determine a state of current passing through a coil of a motor, comprising:
   a high side transistor coupled to the coil, configured to be selectively turned on according to the voltage level of a first control signal and comprising a first body diode;
   a low side transistor coupled to the coil, configured to be selectively turned on according to the voltage level of a second control signal and comprising a second body diode;
   a high side circuit coupled to the high side transistor and configured to output a first determination signal according to a first voltage between two ends of the first body diode and the voltage level of the first control signal;
   a low side circuit coupled to the low side transistor and configured to output a second determination signal according to a second voltage between two ends of the second body diode and the voltage level of the second control signal; and
   a processor configured to output the first control signal and the second control signal, receive the first determination signal and the second determination signal and determine the state of the current according to the voltage level of the first determination signal and the voltage level of the second determination signal.

2. The current determination circuit of claim 1, wherein when the first determination signal is at a first voltage level lower than a second voltage level and the second determination signal is at the first voltage level, the processor determines that the current is zero.

3. The current determination circuit of claim 1, wherein when the first determination signal is at a second voltage level higher than a first voltage level and the second determination signal is at the first voltage level, the processor determines that the current passes through the first body diode after flowing out of the coil.

4. The current determination circuit of claim 1, wherein when the first determination signal is at a first voltage level lower than a second voltage level and the second determination signal is at the second voltage level, the processor determines that the current flows into the coil after passing through the second body diode.

5. The current determination circuit of claim 1, wherein when the first determination signal is at a second voltage level higher than a first voltage level and the second determination signal is at the second voltage level, the processor determines that the state of the current is unknown.

6. The current determination circuit of claim 1, wherein the high side circuit comprises a first comparator coupled to the first body diode and configured to output a first state signal according to the first voltage between two ends of the first body diode.

7. The current determination circuit of claim 6, wherein the high side circuit further comprises a first logic gate, the first logic gate is coupled to the first comparator and the high side transistor and is configured to output the first determination signal according to the voltage level of the first state signal and the voltage level of the first control signal.

8. The current determination circuit of claim 7, wherein when at least one of the first state signal and the first control signal is at low voltage level, the first logic gate outputs the first determination signal with low voltage level.

9. The current determination circuit of claim 7, wherein when the first state signal and the first control signal are both at high voltage level, the first logic gate outputs the first determination signal with high voltage level.

10. The current determination circuit of claim 7, wherein the first logic gate is an AND gate.

11. The current determination circuit of claim 1, wherein the low side circuit comprises a second comparator coupled to the second body diode and configured to output a second state signal according to the second voltage between two ends of the second body diode.

12. The current determination circuit of claim 11, wherein the low side circuit further comprises a second logic gate and a third logic gate, the second logic gate is coupled to the low side transistor and is configured to switch the voltage level of the second control signal, the third logic gate is coupled to the second comparator and the second logic gate and is configured to output the second determination signal according to the voltage level of the second state signal and the voltage level of the second control signal which is switched by the second logic gate.

13. The current determination circuit of claim 12, wherein when at least one of the second state signal and the second control signal which is switched by the second logic gate is at low voltage level, the third logic gate outputs the second determination signal with low voltage level.

14. The current determination circuit of claim 12, wherein when the second state signal and the second control signal which is switched by the second logic gate are both at high voltage level, the third logic gate outputs the second determination signal with high voltage level.

15. The current determination circuit of claim 12, wherein the second logic gate is a NOT gate, and the third logic gate is an AND gate.

16. The current determination circuit of claim 1, wherein the high side transistor further comprises a first end, a second end and a first control end, the two ends of the first body diode are coupled to the first end and the second end, the first end is configured to receive a system high voltage, the second end is coupled to the coil, and the first control end is configured to receive the first control signal.

17. The current determination circuit of claim 1, wherein the low side transistor further comprises a third end, a fourth end and a second control end, the two ends of the second body diode are coupled to the third end and the fourth end, the third end is coupled to the coil, the fourth end is configured to receive a system low voltage, and the second control end is configured to receive the second control signal.

* * * * *